(12) United States Patent
Nagai (10) Patent No.: US 12,495,545 B2
(45) Date of Patent: Dec. 9, 2025

(54) SEMICONDUCTOR MEMORY DEVICE AND METHOD OF FABRICATING THE SAME

(71) Applicant: Fujian Jinhua Integrated Circuit Co., Ltd., Quanzhou (CN)

(72) Inventor: Yukihiro Nagai, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 450 days.

(21) Appl. No.: 18/084,501

(22) Filed: Dec. 19, 2022

(65) Prior Publication Data

US 2023/0403848 A1 Dec. 14, 2023

(30) Foreign Application Priority Data

Jun. 10, 2022 (CN) .......................... 202210657295.4
Jun. 10, 2022 (CN) .......................... 202221455318.5

(51) Int. Cl.
*H10B 12/00* (2023.01)

(52) U.S. Cl.
CPC ............. *H10B 12/50* (2023.02); *H10B 12/09* (2023.02); *H10B 12/482* (2023.02)

(58) Field of Classification Search
CPC ......... H10B 12/482; H10B 12/50; H10D 1/47
See application file for complete search history.

(56) References Cited

U.S. PATENT DOCUMENTS

| | | | |
|---|---|---|---|
| 8,927,385 B2 | 1/2015 | Nandakumar et al. | |
| 10,679,997 B2 | 6/2020 | Jung et al. | |
| 10,840,248 B2 * | 11/2020 | Nagai | H10B 12/485 |
| 2007/0096183 A1 | 5/2007 | Ogawa et al. | |
| 2009/0286378 A1 | 11/2009 | Hase | |
| 2013/0241001 A1 * | 9/2013 | Chen | H01L 23/5228 438/653 |
| 2014/0308785 A1 | 10/2014 | Yeh et al. | |
| 2016/0020205 A1 * | 1/2016 | Song | H10D 64/258 257/379 |
| 2016/0260704 A1 * | 9/2016 | Huo | H01L 21/76202 |

* cited by examiner

*Primary Examiner* — Edward Chin
(74) *Attorney, Agent, or Firm* — Winston Hsu (57) ABSTRACT

The present disclosure provides a semiconductor memory device and a fabricating method thereof, which includes a substrate, a bit line structure and a resistor structure. The substrate has a plurality of active areas and an isolating region. The resistor structure includes a first semiconductor layer and a first capping layer from bottom to top. The bit line structure includes a second semiconductor layer, a first conductive layer, and a second capping layer from bottom to top, wherein the first semiconductor layer and the second semiconductor layer include coplanar top surface and a same semiconductor material. In this way, the resistor formed thereby is allowable to obtain structural reliability and stable surface resistance, under a simplified process flow.

20 Claims, 9 Drawing Sheets

SEMICONDUCTOR MEMORY DEVICE AND METHOD OF FABRICATING THE SAME

BACKGROUND OF THE INVENTION

1. Field of the Invention

The present disclosure relates generally to a semiconductor device and a method of fabricating the same, and more particularly to a semiconductor memory device and a method of fabricating the same.

2. Description of the Prior Art

According to the current semiconductor technology, it is able to integrate control circuits, memories, low-voltage operating circuits, and high-voltage operating circuits and components on a single chip together, thereby reducing costs and improving operating efficiency. In addition, as the size of semiconductor components becomes smaller and smaller, there are many improvements in the process steps of forming transistors, memories, and resistors to fabricate various semiconductor components with small volume and high quality. However, as the size of devices continues to decrease, it becomes more difficult to dispose more than one semiconductor component within the same device, and the fabricating process thereof also faces many limitations and challenges. Thus, the currently semiconductor technology still requires further improvements to meet the industrial requirements to promote the fabricating efficiency, as well as the functions and reliability of the device.

SUMMARY OF THE INVENTION

An object of the present disclosure is to provide a semiconductor memory device and a fabricating method thereof, where a memory and a resistor are simultaneously formed within the same device. In this way, the resistor formed thereby is allowable to obtain better structural reliability and stable surface resistance, under a simplified process flow.

To achieve the aforementioned objects, the present disclosure provides a semiconductor memory device including a substrate, a bit line structure, and a resistor structure. The substrate has a plurality of active areas and an isolating region. The resistor structure is disposed on the isolating region, and includes a first semiconductor layer, a first capping layer disposed on the first semiconductor layer, and a first spacer. The first spacer directly contacts sidewalls of the first semiconductor layer and the first covering layer. The bit line structure is disposed on the substrate to intersect the active areas and the isolating region. The bit line structure includes a second semiconductor layer, a first barrier layer disposed on the second semiconductor layer, a first conductive layer disposed on the first barrier layer, a second covering layer disposed on the first conductive layer, and a second spacer, wherein the second spacer directly contacts sidewalls of the second semiconductor layer, the first barrier layer, the conductive layer, and the second covering layer.

To achieve the aforementioned objects, the present disclosure provides a semiconductor memory device including a substrate, a bit line structure, and a resistor structure. The substrate has a plurality of active areas and an isolating region. The resistor structure is disposed on the isolating region, and includes a first semiconductor layer and a first capping layer from bottom to top. The bit line structure is disposed on the substrate to intersect the active areas and the isolating region, and the bit line structure includes a second semiconductor layer, a first barrier layer, a first conductive layer, and a second covering layer from bottom to top. The first semiconductor layer and the second semiconductor layer include coplanar top surfaces and a same semiconductor material.

To achieve the aforementioned objects, the present disclosure provides a method of fabricating a semiconductor device including the following step. Firstly, a substrate is provided, and the substrate has a plurality of active areas and an isolating region. Next, a resistor structure is formed on the isolating region, and the resistor structure includes a first semiconductor layer, a first capping layer disposed on the first semiconductor layer, and a first spacer. The first spacer directly contacts sidewalls of the first semiconductor layer and the first covering layer. Then, the bit line structure is formed on the substrate to intersect the active areas and the isolating region, and the bit line structure includes a second semiconductor layer, a first barrier layer disposed on the second semiconductor layer, a first conductive layer disposed on the first barrier layer, a second covering layer disposed on the first conductive layer, and a second spacer. The second spacer directly contacts sidewalls of the second semiconductor layer, the first barrier layer, the conductive layer, and the second covering layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 2 to FIG. 9 illustrate schematic diagrams of a fabricating method of a semiconductor memory device according to one embodiment of the present disclosure, wherein:

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
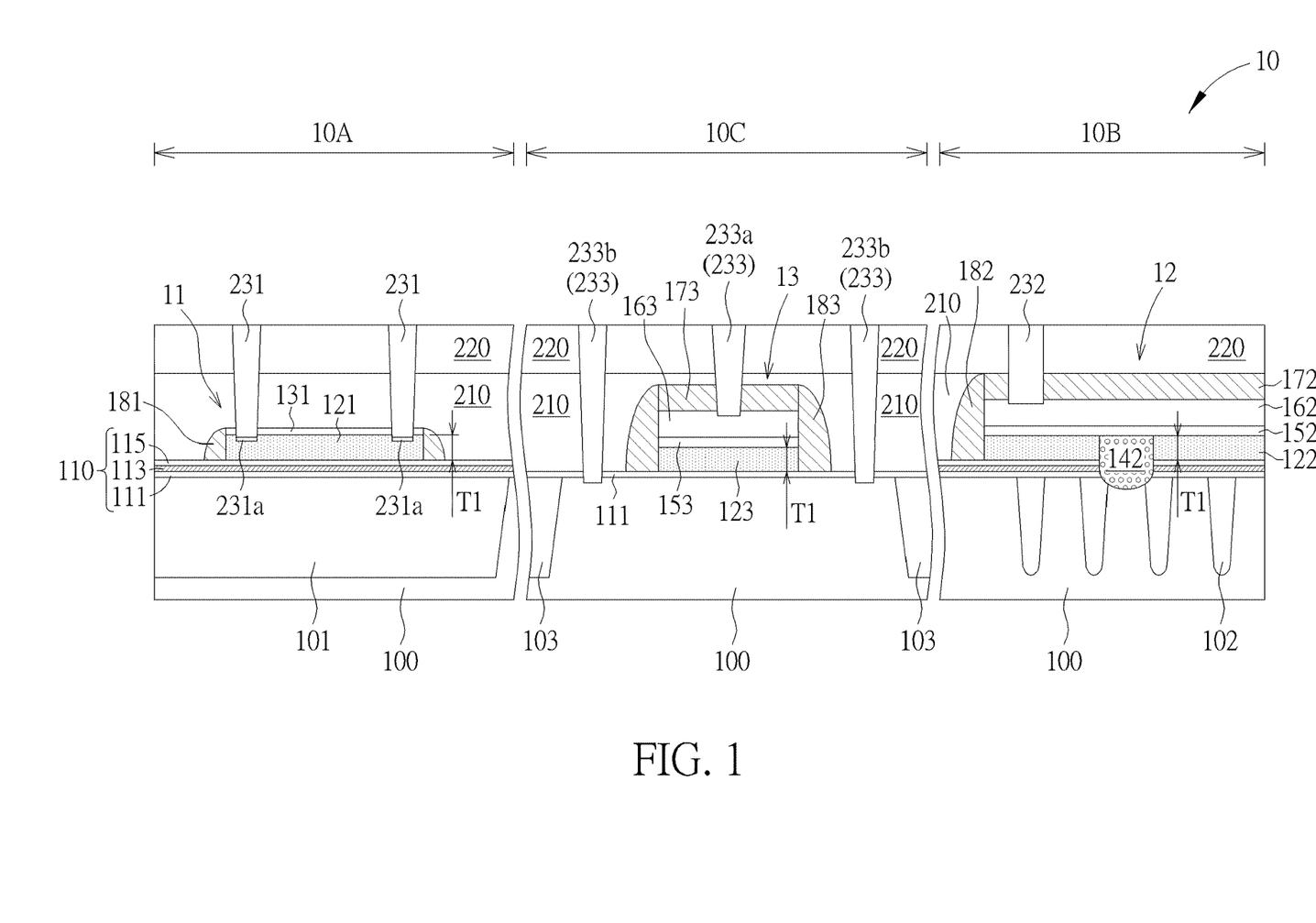
FIG. 1 illustrates a schematic diagram of a cross-sectional view of a semiconductor memory device according to one embodiment of the present disclosure.

Please refer to FIG. 1, which illustrating a schematic diagram of a cross-sectional view of a semiconductor memory device 10 according to one embodiment of the present disclosure. The semiconductor memory device 10 includes a substrate 100, such as a silicon substrate, an epitaxial silicon substrate, or a silicon on insulation (SOI) substrate, and the substrate 100 further includes a plurality of isolating regions 101, 102, 103 such as being shallow trench isolations (STIs) disposed therein, so as to define a plurality of active areas (not shown in the drawings) within the substrate 100. The substrate 100 for example includes at least three regions, a first region 10A, a second region 10B, and a third region 10C for disposing different semiconductor components, and each of the isolating regions 101, 102, 103 is respectively disposed within the first region 10A, the second region 10B, and the third region 10C. In the preset embodiment, the first region 10A for example includes a resistor region, with a resistor structure 11 being disposed within the first region 10A, the second region 10B for example includes a memory region, with a bit line (BL) structure 12 being disposed within the second region 10B, and the third region 10C for example includes a transistor region, with a gate line structure 13 being disposed within the third region 10C, but is not limited thereto. To people well-skilled in the arts, the first region 10A, the second region 10B, and the third region 10C may be disposed directly adjacent to each other, or, another region may be further disposed therebetween. For example, a periphery region (not shown in the drawings) is additionally disposed within the second region 10B and the third region 10C, but not limited thereto.

As shown in FIG. 1, the resistor structure 11 is disposed within the isolating region 101, and a composited dielectric layer 110 is further disposed between the resistor structure 11 and the isolating region 101. The resistor structure 11 precisely includes a first semiconductor layer 121 and a first capping layer 131 stacked from bottom to top, and a first spacer 181. It is noted that the first spacer 181 is disposed on the top surface of the composited dielectric layer 110, and directly contacts sidewalls of the first semiconductor layer 121 and the first capping layer 131 of the resistor structure 11 at the same time, as shown in FIG. 1. The composited dielectric layer 110 is disposed on the substrate 100 to cover the active areas and the isolating regions 101, 102, and which preferably includes a first silicon oxide layer 111—a silicon nitride layer 113—a second silicon oxide layer 115 (oxide-nitride-oxide, ONO) structure stacked from bottom to top, but not limited thereto. Accordingly, the bottom surface of the first spacer 181 may be directly in contact with the top surface of the second silicon oxide layer 115.

On the other hand, the bit line structure 12 is disposed on the substrate 100 to extend along a direction (not shown in the drawings) to simultaneously intersect the active areas and the isolating regions 102, and the composited dielectric layer 110 is also disposed between the bit line structure 12 and the substrate 100. Although the extending directions of the active areas, each isolating region 102 and the bit line structure 12 are not specifically depicted in the drawings of the present embodiment, it may be easily understood by those skilled in the art that the extending direction of the bit line structure 12 is different from the extending direction of the active areas, with the bit line structure 12 across the active areas. Precisely speaking, the bit line structure 12 may further include a second semiconductor layer 122, a first barrier layer 152, a first conductive layer 162, and a second capping layer 172 stacked from bottom to top, and a second spacer 182. It is noted that, the second spacer 182 is disposed on the top surface of the composited dielectric layer 110, to directly contact sidewalls of the second semiconductor layer 122, the first barrier layer 152, the first conductive layer 162, and a second capping layer 172, so that, the top surface of the second spacer 182 may be obviously higher than the top surface of the first spacer 181, as shown in FIG. 1. Furthermore, a bit line contact (BLC) 142 is disposed under the bit line structure 12, and which is penetrated through the second semiconductor layer 122 of the bit line structure 12 and the composited dielectric layer 110 underneath, to extend into the active areas of the substrate 100 to directly contact the active areas. In the present embodiment, the bit line contact 142 and the second semiconductor layer 122 of the bit line structure 12 are separately formed through various fabricating processes, so that, the bit line contact 142 and the second semiconductor layer 122 of the bit line structure 12 may include different semiconductor materials. For example, the bit line contact 142 for example includes silicon phosphorus (SiP), and the second semiconductor layer 122 for example includes polysilicon, but is not limited thereto.

It is also noted that, in the present embodiment, the first semiconductor layer 121 of the resistor structure 11 and the second semiconductor layer 122 of the bit line structure 12 may be formed through the same fabricating process, so that, the first semiconductor layer 121 and the second semiconductor layer 122 may therefore include the same semiconductor material (for example both including polysilicon), the same disposing position (for example both being disposed on the second oxide layer 115 of the composited dielectric layer 110), and the same thickness "T1", but not limited thereto. In other words, the first semiconductor layer 121 and the second semiconductor layer 122 may include coplanar top surfaces, as shown in FIG. 1. Moreover, the first capping layer 131 of the first resistor structure 11 for example includes a material like silicon oxide or silicon oxynitride, and the first barrier layer 152 of the bit line structure 12 for example include a material like titanium (Ti) and/or titanium nitride (TiN), tantalum (Ta) and/or tantalum nitride (TaN), the first conductive layer 162 for example includes a low-resistant metal like aluminum (Al), Ti, copper (Cu), or tungsten (W), and the second capping layer 172 for example including a material like silicon nitride or silicon carbonitride, and preferably includes a material which is different from that of the first capping layer 131, but not limited thereto.

It is noteworthy that, in addition to the bit line structure 12, a plurality of gate structures (not shown in the drawings), at least one transistor (not shown in the drawings) and at least one capacitor (not shown in the drawings) are further disposed in the substrate 100 within the second region 10B, to together form a dynamic random access memory (DRAM) device with a buried gate. The transistor and the capacitor may be consisted of the smallest memory cell of the DRAM array, so as to receiving the voltage signals from the bit line structure 12 and a word line (WL, not shown in the drawings).

On the other hand, the gate line structure 13 is disposed on the substrate 100, and which is isolated from other elements by the isolating regions 103 of the substrate 100, wherein only the first silicon oxide layer 111 is disposed between the gate line structure 13 and the substrate 100, and the gate line structure 13 may be directly disposed on the top surface of the silicon oxide layer 111, as shown in FIG. 1. Precisely speaking, the gate line structure 13 further includes a third semiconductor layer, 123, a second barrier layer 153, a second conductive layer 163, and a third capping layer 173 stacked from bottom to top, and a third spacer 182. It is noted that, the third spacer 182 is disposed on the first silicon oxide layer 111, so as to simultaneously contact sidewalls of the third semiconductor layer 123, the second barrier layer 153, the second conductive layer 163, and the third capping layer 173. Then, the top surface of the third spacer 183 may be slightly lower than the top surface of the second spacer 182. In the present embodiment, the gate line structure 13 and the bit line structure 12 may be formed through the same fabricating process, so that, the third semiconductor layer 123, the second barrier layer 153, the second conductive layer 163, the third capping layer 173, and the third spacer 183 of the gate line structure 13 may respectively include the same material and the same thickness of the second semiconductor layer 122, the first barrier layer 152, the first conductive layer 162, the second capping layer 172, and the second spacer 182 of the bit lien structure 12, but not limited thereto. In addition, the third semiconductor layer 123 of the gate line structure 13, the first semiconductor layer 121 of the resistor structure 11, and the second semiconductor layer 122 of the bit line structure 12 may be formed simultaneously, so as to include the same material (for example all including polysilicon) and the same thickness "T1". However, since the third semiconductor layer 123 of the gate line structure 13 is directly disposed on the first silicon oxide layer 111, and which is disposed at a related lower horizontal position in a direction which is perpendicular to the substrate 100, the first semiconductor layer 121 and the second semiconductor layer 122 are disposed at a related higher horizontal position in the direction, being higher than that of the third semiconductor layer 123, as shown in FIG. 1.

Further in view of FIG. 1, the semiconductor memory device 10 further includes a plurality of plugs 231, 232, 233, to electrically connect to the resistor structure 11 within the first region 10A, the bit line structure 12 within the second region 10B, and the gate line structure 13 within the third region 10C, respectively, wherein each of the plugs 231, 232, 233 is disposed within the interlayer dielectric layer 210 and the intermetal dielectric layer 220 stacked on the substrate 100. The interlayer dielectric layer 210 completely covers the resistor structure 11 within the first region 10A and the gate line structure 13 within the third region 10C, with the top surface of the interlayer dielectric layer 210 being coplanar with the top surface of the second capping layer 172 of the bit line structure 12. It is noted that, in the present embodiment, each of the plugs 231 disposed within the first region 10A penetrates through the first capping layer 131 to directly contact the first semiconductor layer 121 of resistor structure 11. Also, since the first semiconductor layer 121 for example includes a semiconductor material like polysilicon, a silicide layer 231a may be further disposed between the first semiconductor layer 121 and the plugs 231, so as to enhancing the electrically connection between the first semiconductor layer 121 and the plugs 231. The plug 232 disposed within the second region 10B penetrates through the second capping layer 172 to directly contact the first conductive layer 162, and the plugs 233 disposed within the third region 10C further includes a plug 233a which is penetrated through the third capping layer 172 to direct contact the second conductive layer 263 of the gate line structure 13, and a plug 233b which is penetrated through the second silicon oxide layer 111 to directly contact two source/drain regions within the substrate 100 at two sides of the gate line structure 13.

Through these arrangements, the semiconductor memory device 10 is capable to include the resistor structure 11, the bit line structure 12, and the gate line structure 13 respectively disposed in various regions (including the first region 10A, the second region 10B, and the third region 10C). The resistor structure 11 is consisted of the first semiconductor layer 121 having the same material with a portion of the bit line structure 12, which may not only gain better structural reliability, but also obtains a related higher, stable surface resistance. In this way, the semiconductor memory device 10 may therefore achieve better functions and device performance.

For those skilled in the art, the semiconductor memory device 10 of the present disclosure is not limited to be the aforementioned embodiment and may include other examples or embodiments, so as to meet the practical product requirements. In addition, in order to enable those skilled in the art to realize the semiconductor memory device 10 of the present disclosure, a fabricating method of the semiconductor memory device 10 according to the present disclosure will be further described in detail in the following paragraphs.

Figure 2:
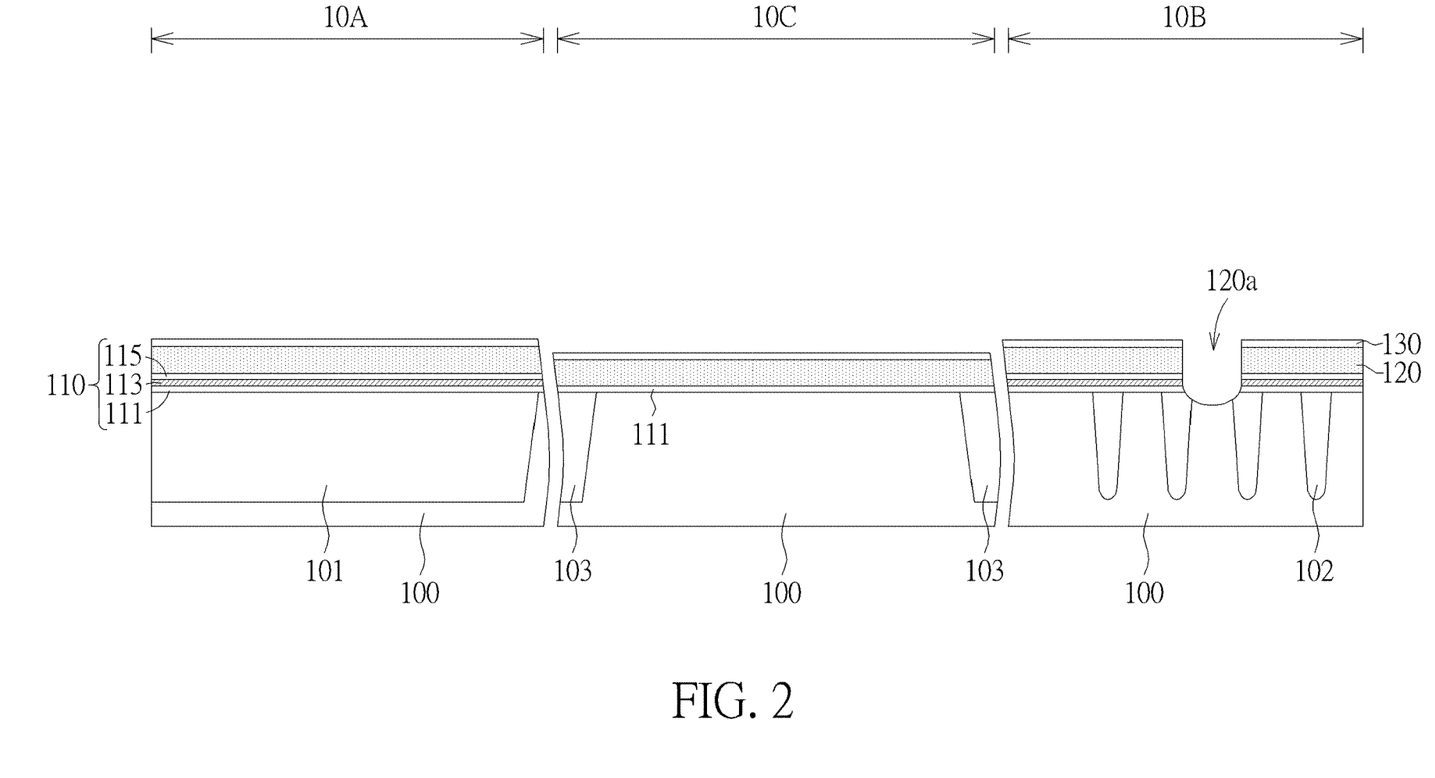
FIG. 2 is a schematic cross-sectional view of a semiconductor memory device after forming a contact opening.

As shown in FIG. 2 to FIG. 9, FIG. 2 to FIG. 9 illustrate schematic diagrams of a fabricating method of a semiconductor memory device 10 according to one embodiment of the present disclosure. Firstly, as shown in FIG. 2, the substrate 100 is provided, and which includes at least three regions defined thereon, for example including the first region 10A, the second region 10B, and the third region 10C. Also, a plurality of active areas (not shown in the drawings) and a plurality of the isolating regions 101, 102, 103 are formed in the substrate 100, within the first region 10A, the second region 10B, and the third region 10C, respectively. Next, plural deposition processes are sequentially performed on the substrate 100 to form the composited dielectric layer 110, a semiconductor material layer 120 and a first capping material layer 130 stacked from bottom to top, wherein the composited dielectric layer 110 preferably includes the first silicon oxide layer 111—the silicon nitride layer 113—the second silicon oxide layer 115 structure stacked from bottom to top. The semiconductor material layer 120 for example includes a semiconductor material like polysilicon, and the first capping material layer 130 may include an insulating material $SiO_x$, or SiON, but not limited thereto.

It is noted that, the composited dielectric layer 110 may be firstly formed to entirely cover the active areas and the isolating regions 101, 102, 103 within the first region 10A, the second region 10B, and the third region 10C, and the second silicon oxide layer 115 and the silicon nitride layer 113 within the third region 10C are removed before the depositing the semiconductor material layer 120. Then, the active areas and the isolating regions 103 within the third regions 10C may only be covered by the first silicon oxide layer 111, as shown in FIG. 1. Accordingly, the semiconductor material layer 120 and the first covering material layer 130 formed subsequently in the third region 10C may therefore obtain a related lower position, in comparison with the semiconductor material layer 120 and the first covering material layer 130 formed in other regions. Otherwise, in another embodiment, the composited dielectric layer 110 within the third region 10C may be optionally removed, to expose the top surface of the substrate 100, and then, an additional thermal oxidation process may be performed to form a silicon oxide layer (not shown in the drawings) on the exposed top surface of the substrate 100. Moreover, as shown in FIG. 1, after forming the first covering material layer 130, an etching process may be performed through a mask layer (not shown in the drawings), to define a contact opening 120a in the second region 10B, with the contact opening 120a being penetrated through the first covering material layer 130, the semiconductor material layer 120, and the composited dielectric layer 110 sequentially, to partially exposed the substrate 100.

Figure 3:
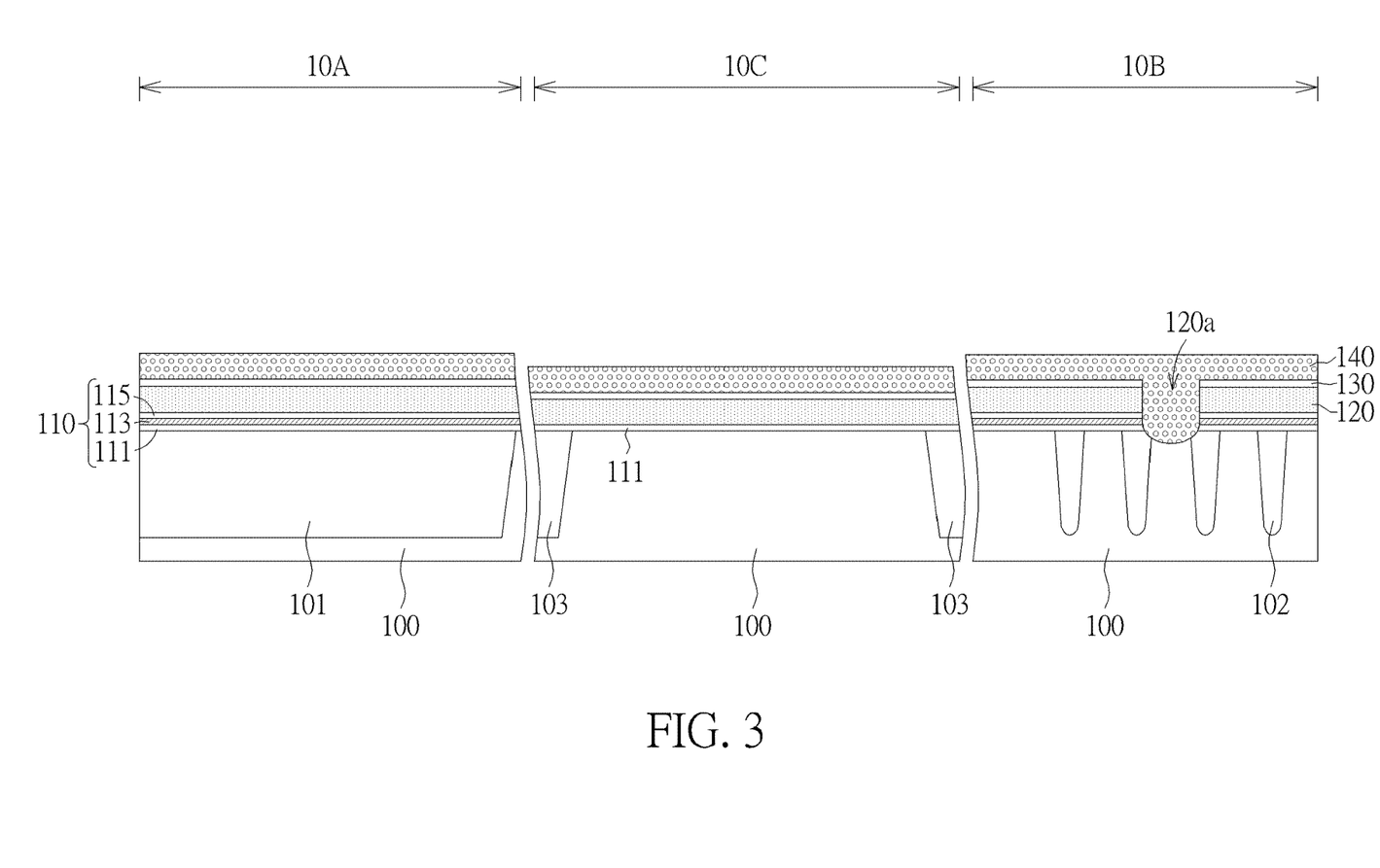
FIG. 3 is a schematic cross-sectional view of a semiconductor memory device after forming a semiconductor material layer.

As shown in FIG. 3, another deposition process is next performed to form a conductor material layer 140 on the substrate 100 to fill up the contact opening 120a within the second region 10B, and to further cover on the first region 10A, the second region 10B, and the third region 10C. In one embodiment, the conductor material layer 140 for example includes a semiconductor material like polysilicon, or silicon phosphate (SiP), and preferably includes silicon phosphate, but not limited thereto.

Figure 4:
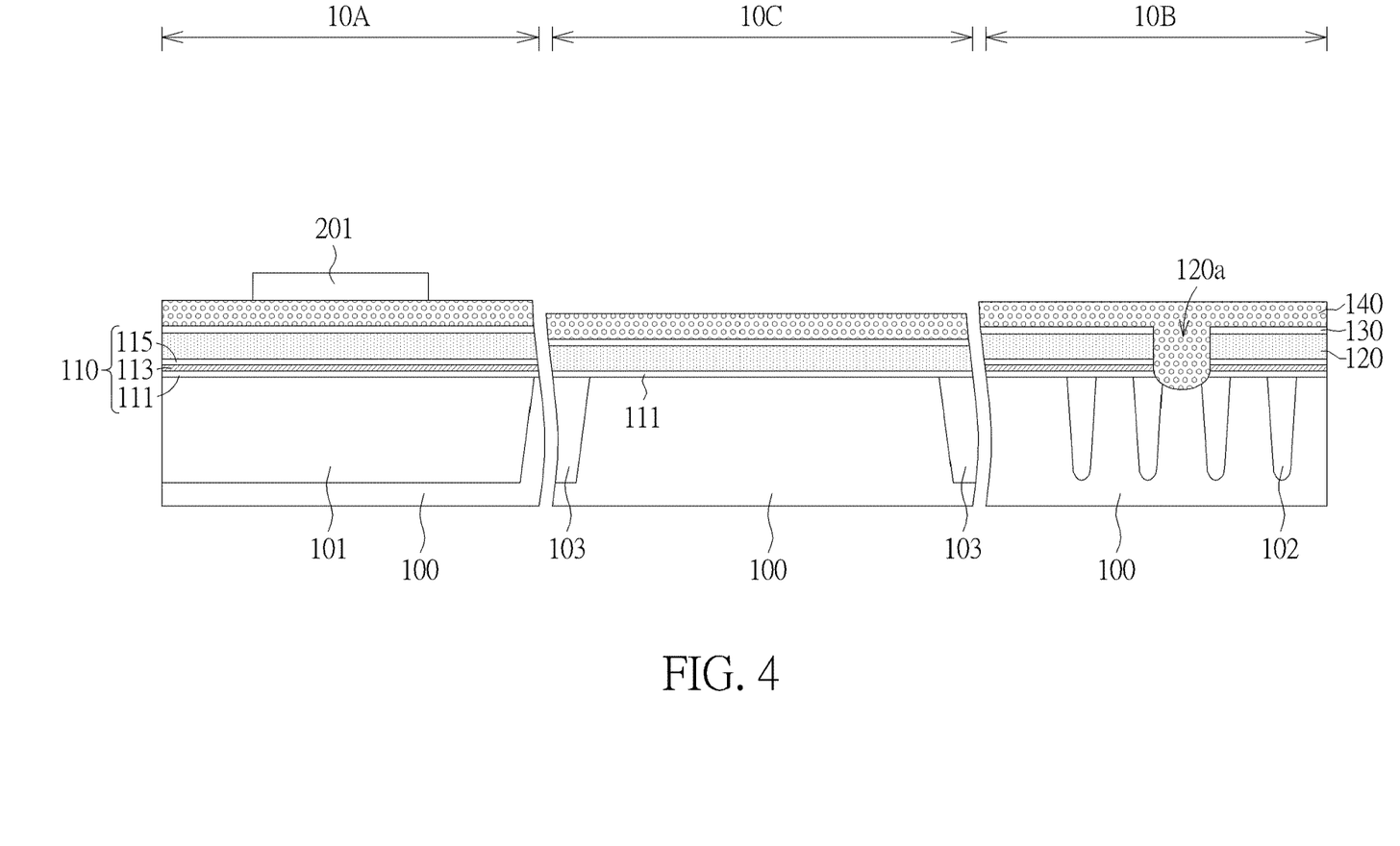
FIG. 4 is a schematic cross-sectional view of a semiconductor memory device after forming a mask layer.
Figure 5:
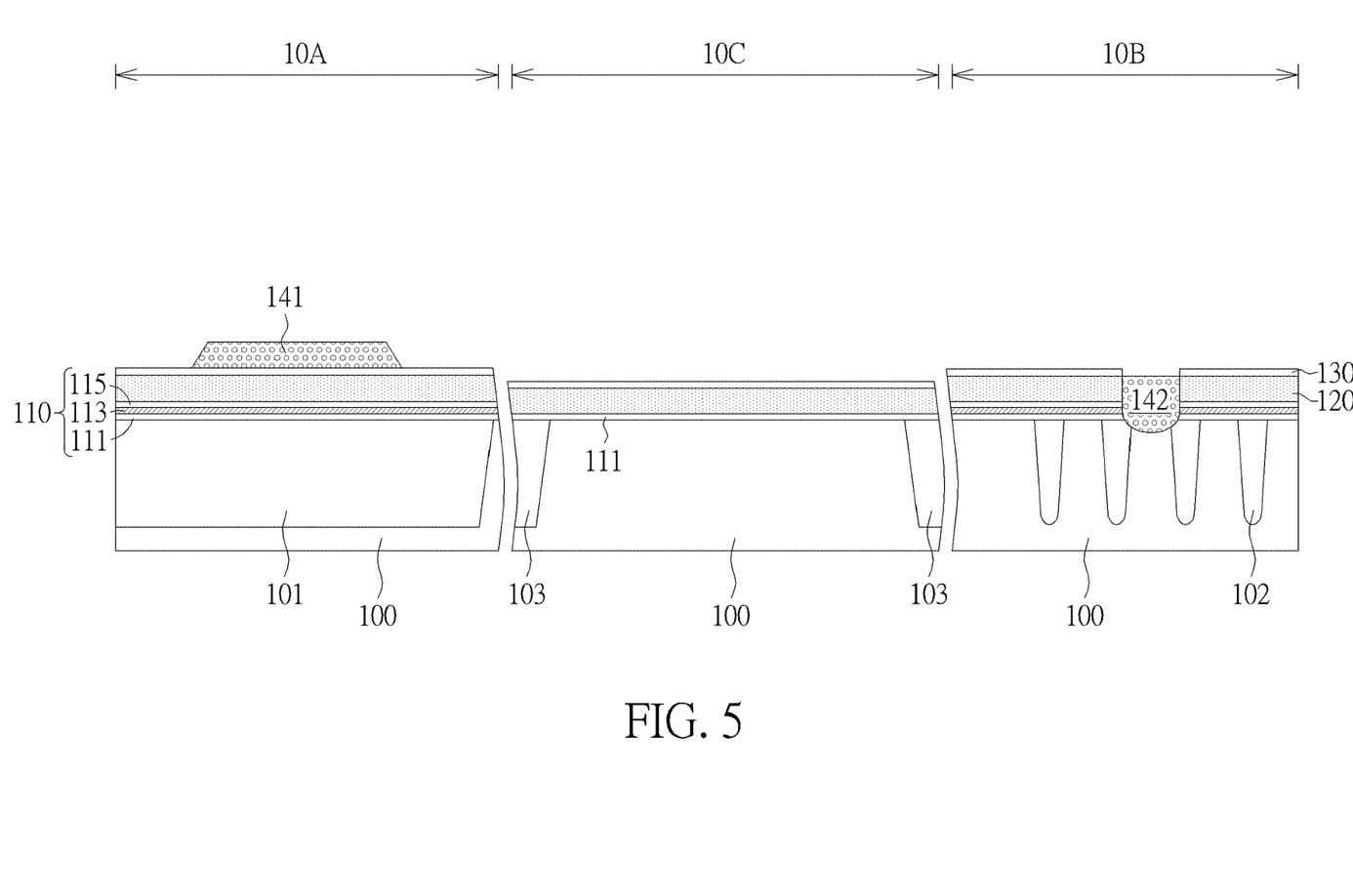
FIG. 5 is a schematic cross-sectional view of a semiconductor memory device after forming a bit line contact.

As shown in FIG. 4, a first mask layer 201 is formed in the first region 10A to cover on the conductor material layer 140, and a patterning process is performed through the first mask layer 201, to transfer the pattern of the first mask layer 201 into the conductor material layer 140 underneath, to form a mask pattern 141 as shown in FIG. 5. Meanwhile, while performing the patterning process, the conductor material layer 140 covered on the first capping material layer 130 is completely removed, and the conductor material layer 140 filled in the contact opening 120a is partially removed, to form a contact namely the bit line contact 142 in the contact opening 120a, as shown in FIG. 5. Then, the first mask layer 201 is completely removed.

Figure 6:
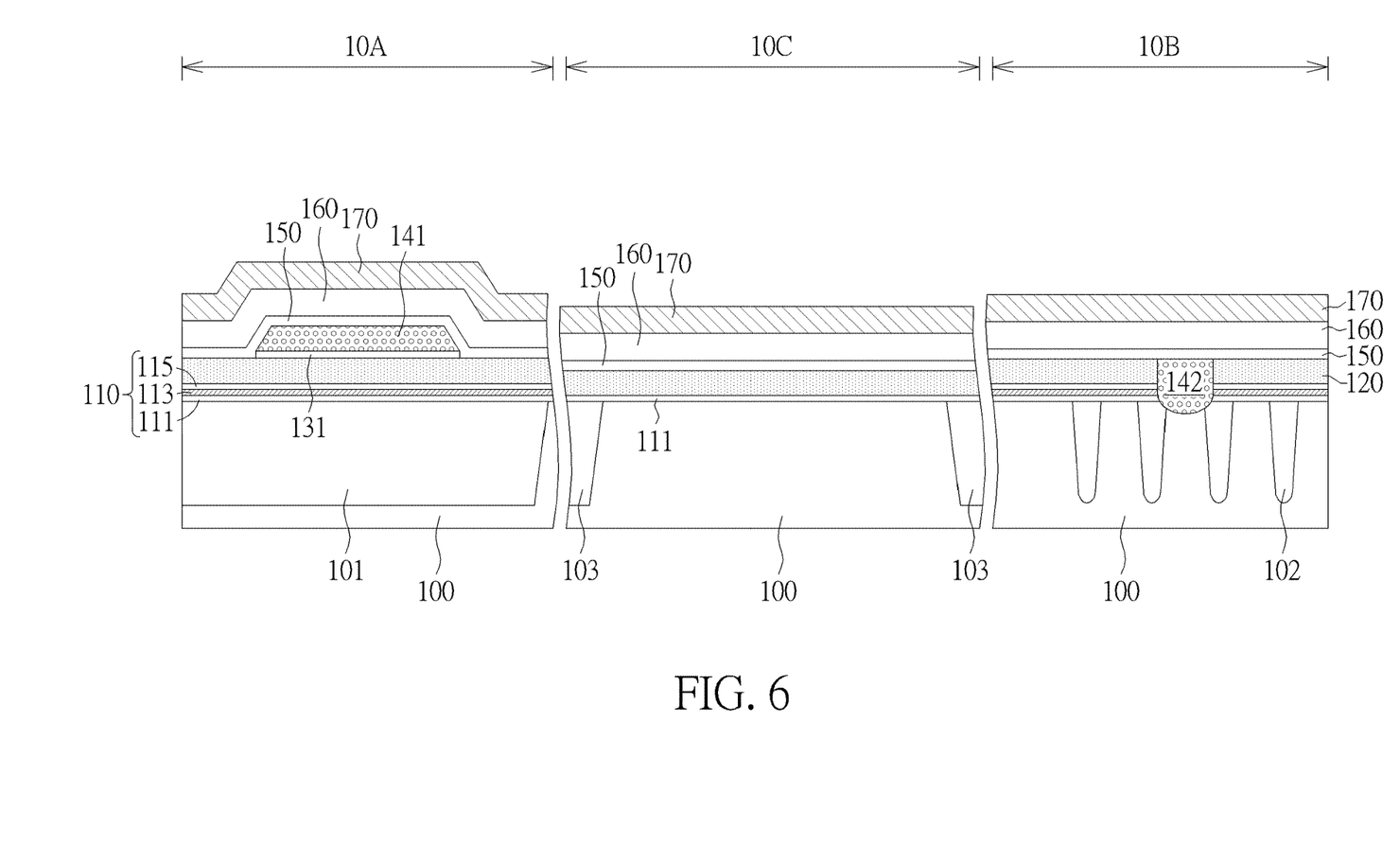
FIG. 6 is a schematic cross-sectional view of a semiconductor memory device after forming covering material layer.

As shown in FIG. 6, another patterning process is next performed through the mask pattern 141, to transfer the pattern of the mask pattern 141 into the first capping material 130 underneath, to form the first capping layer 131 in the first region 10A, and to completely remove the first capping material layer 130 within the second region 10B and the third region 10C. Following these, plural deposition processes are sequentially performed on the substrate 100, to form a barrier material layer 150, a conductive material layer 160, and a second capping material layer 170 stacked from bottom to top on the first capping layer 131. The barrier material layer 150, the conductive material layer 160, and the second capping material layer 170 are conformally formed on the first region 10A, the second region 10B, and the third region 10C, with the barrier material layer 150 for example including a material like Ti and/or TiN, Ta and/or TaN, the conductive material layer 160 for example including a low-resistant metal material like Al, Ti, Cu, or Ti, and the second capping material layer 170 for example including a material like SiN or SiCN, but not limited thereto.

Figure 7:
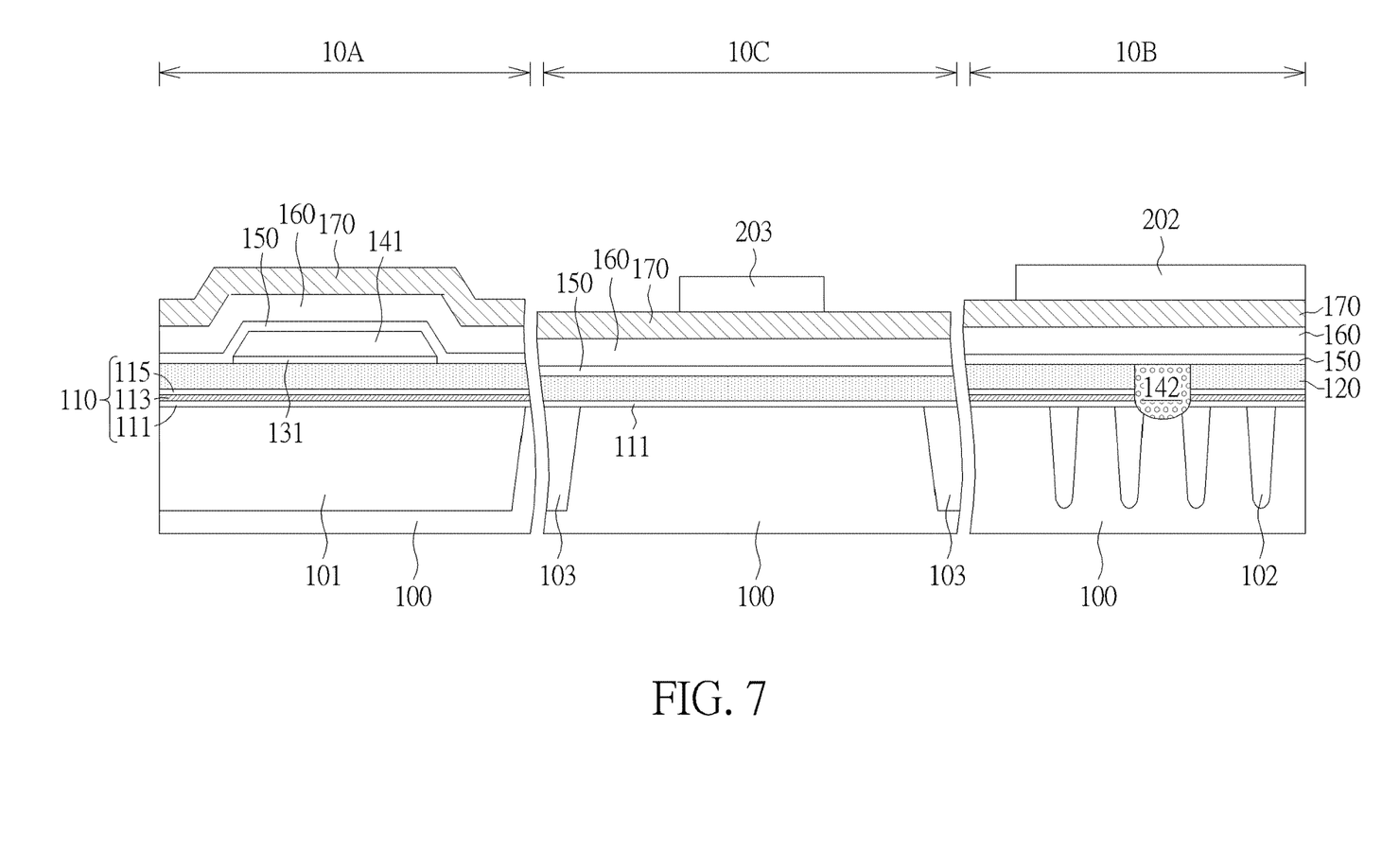
FIG. 7 is a schematic cross-sectional view of a semiconductor memory device after forming another mask layer.
Figure 8:
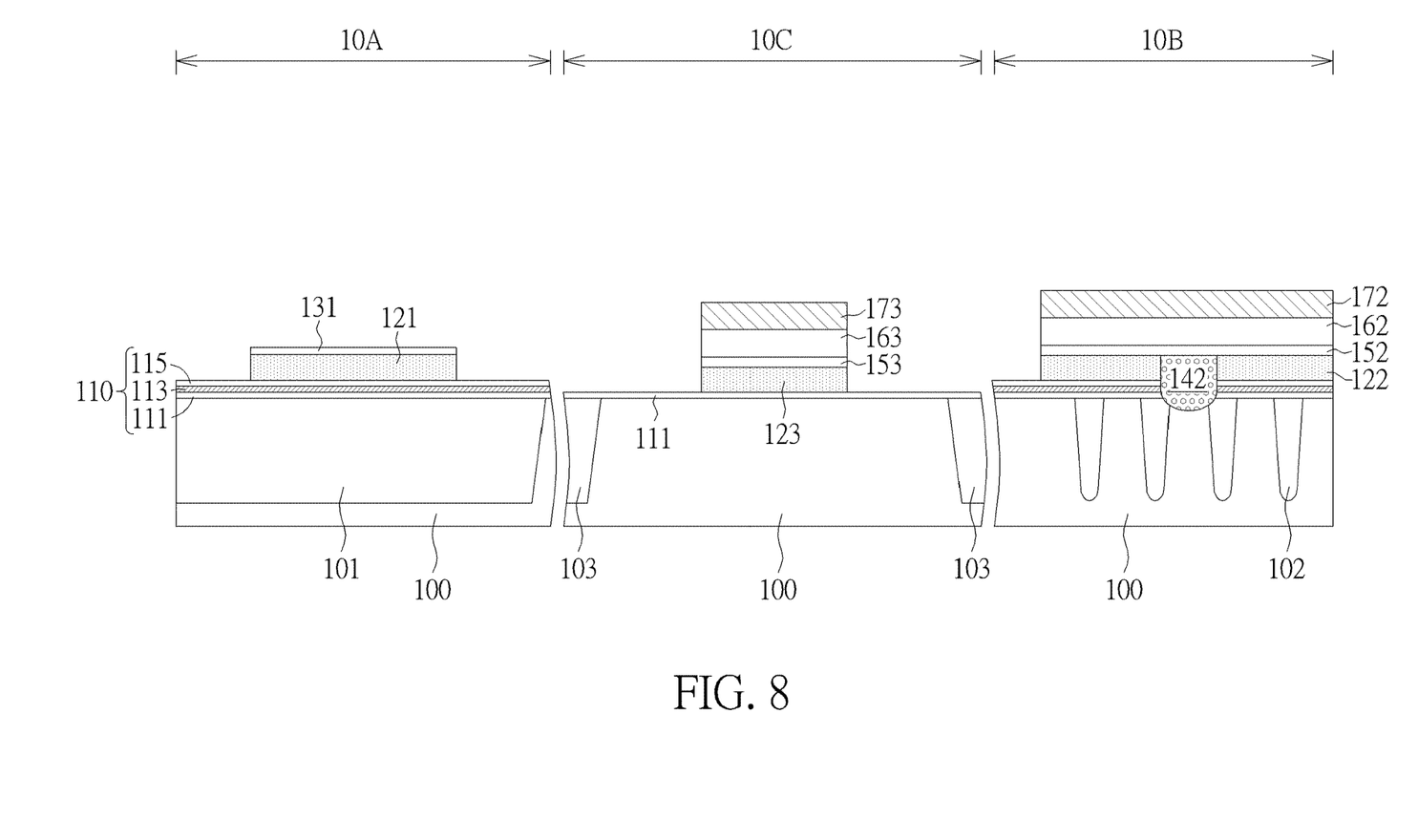
FIG. 8 is a schematic cross-sectional view of a semiconductor memory device after performing a patterning process.

As shown in FIG. 7, second mask layers 202, 203 are respectively formed within the second region 10B and the third region 10C, to cover the second capping material layer 170, and then, another patterning process is performed through the second mask layers 202, 203, to transfer the pattern of the second mask layers 202, 203 into each of the stacked layers (including the second capping material layer 170, the conductive material layer 160, and the semiconductor material layer 120) underneath, to form stacked structures as shown in FIG. 8 within each region (including the first region 10A, the second region 10B, and the third region 10C). It is noted that, the second mask layers 202, 203 are only formed within the second region and the third region 10C, so that, the second capping material layer 170, the conductive material layer 160, and the barrier material layer 150 within the first region 10A may be completely removed, to expose the first capping layer 131. Then, the first capping layer 131 is used as an etching mask to further pattern the semiconductor material layer 120 covering on the first region 10A, to form the first semiconductor layer 121. On the other hand, the stacked structure within the second region 10B includes the second semiconductor layer 122, the first barrier layer 152, the first conductive layer 162, and the second capping layer 172 stacked from bottom to top, and the stacked structure within the third region 10C includes the third semiconductor layer 123, the second barrier layer 153, the second conductive layer 163, and the third capping layer 173 stacked from bottom to top, as shown in FIG. 8. Then, the second mask layers 202, 203 are removed.

Figure 9:
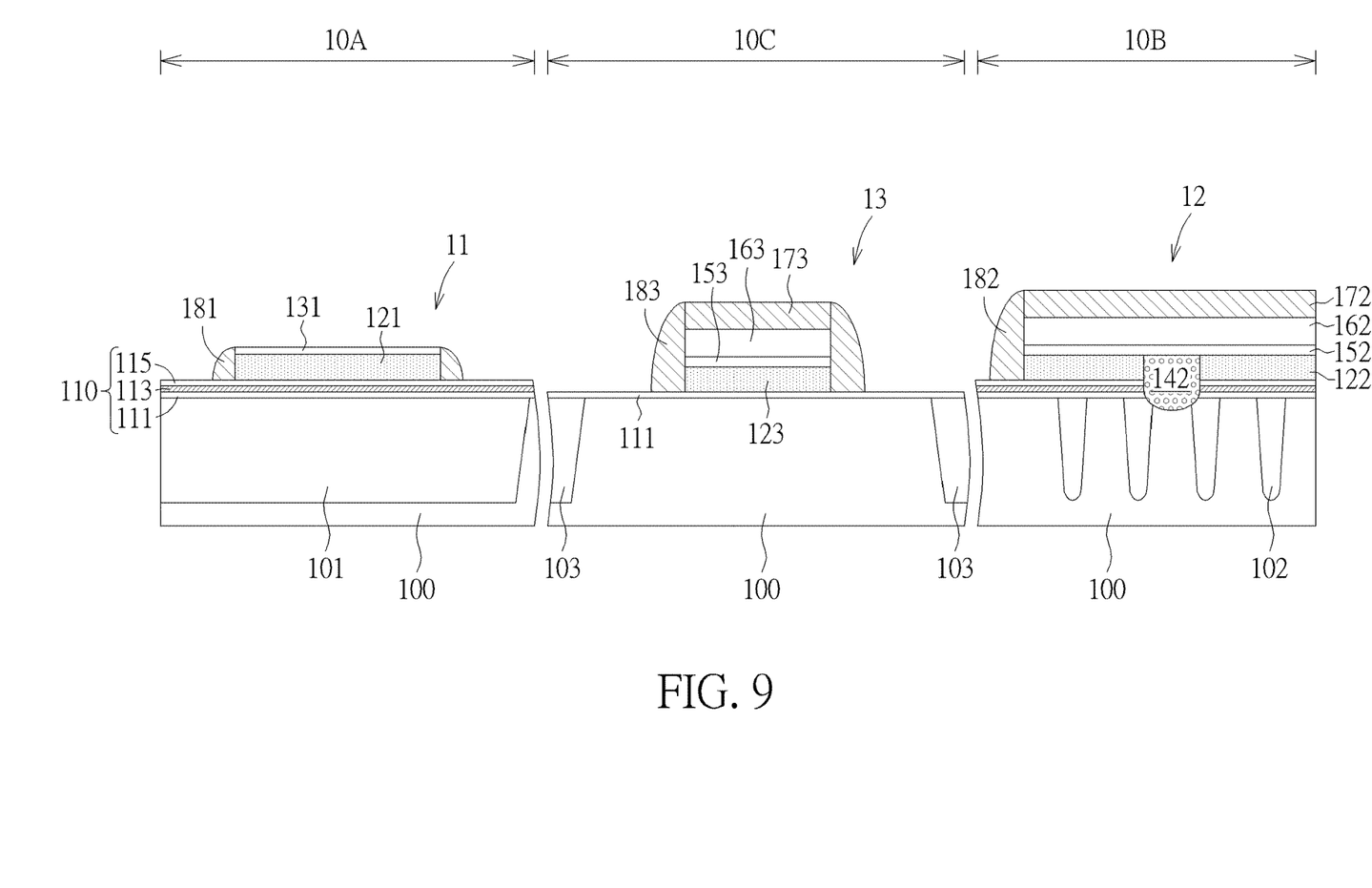
FIG. 9 is a schematic cross-sectional view of a semiconductor memory device after forming a spacer.

Following these, as shown in FIG. 9, a deposition process and an etching back process are sequentially performed, to form the first spacer 181 on the sidewalls of the first semiconductor layer 121 and the first capping layer 131 stacked on one over another in the first region 10A, to form the second spacer 182 on the sidewalls of the second semiconductor layer 122, the first barrier layer 152, the first conductive layer 162, and the second capping layer 172 stacked on one over another in the second region 10B, and also, to form the third spacer 183 on the sidewalls of the third semiconductor layer 123, the second barrier 153, the second conductive 163, and the third capping layer 172 stacked on one over another in the third region 10C. Accordingly, the first spacer 181, the second spacer 182, and the third spacer 183 may all include the same material like SiN, SiCN, but is not limited thereto. Then, the interlayer dielectric layer 210 and the intermetal dielectric layer 220, are sequentially formed on the substrate 100 and the plugs 231, 232, 233 are formed therein, wherein the interlayer dielectric layer 210 completely covers the resistor structure 11 in the first region 10A, and the gate line structure 13 in the third region 10C, and the top surface of the interlayer dielectric layer 210 may be coplanar with the top surface of the second capping layer 172 of the bit line structure 12, thereby forming the semiconductor memory device 10 as shown in FIG. 1.

Through these performances, the fabrication of the semiconductor memory device 10 according to one embodiment of the present disclosure is accomplished. According to the aforementioned processes, the resistor structure 11 and the bit line structure 12 are allowable to be simultaneously formed in the first region 10A and the second region 10B, respectively. In other words, within the fabricating method of the present disclosure, the formation of the resistor structure 11 is integrated in to a general fabricating process of the bit line structure 12, and the first semiconductor layer 121 of the resistor structure 11 is formed while forming the second semiconductor layer 122 of the bit line structure 12. In this way, the resistor may be successfully formed within a region (namely, the first region 10A) while forming a memory in another region (namely, the second region 10B) of the semiconductor memory device 10, so as to promote the fabricating efficiency of the resistor structure 11. Moreover, the fabricating method of the present embodiment also enables to from the gate line structure 13 in the third region 10C simultaneously, so that, the formation of the gate line structure 13 may also be integrated into the general fabricating process of the bit line structure 12, so as to significantly improve the fabrication efficiency of the semiconductor memory device 10, and also to obtain the semiconductor memory device 10 with better functions and performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a substrate having a plurality of active areas and a plurality of isolating regions;
a resistor structure disposed on one of the plurality of isolating regions, comprising:
a first semiconductor layer;
a first capping layer, disposed on the first semiconductor layer; and
a first spacer, directly in contact with sidewalls of the first semiconductor layer and the first capping layer; and
a bit line structure, disposed on the substrate to intersect the active areas and a portion of the plurality of isolating regions, and the bit line structure comprising:
a second semiconductor layer;
a first conductive layer, disposed on the second semiconductor layer;
a second capping layer, disposed on the first conductive layer; and
a second spacer, directly in contact with sidewalls of the second semiconductor layer, the first conductive layer, and the second capping layer.

2. The semiconductor memory device according to claim 1, further comprising:
a composited dielectric layer, disposed on the substrate and covering the active areas and the plurality of isolating regions, wherein the composited dielectric layer comprises a first silicon oxide layer, a silicon nitride layer and a second silicon oxide layer stacked from bottom to top.

3. The semiconductor memory device according to claim 2, wherein the first spacer of the resistor structure and the second spacer of the bit line structure are respectively disposed on the composited dielectric layer.

4. The semiconductor memory device according to claim 1, further comprising:
an interlayer dielectric layer, disposed on the resistor structure of the interlayer dielectric layer is flushed with a top surface of the second capping layer of the bit line structure.

5. The semiconductor memory device according to claim 4, wherein a top surface of the interlayer dielectric layer is higher than a top surface of first capping layer.

6. The semiconductor memory device according to claim 1, further comprising:
a plurality of plugs, disposed on the substrate, one of the plugs directly contacts the first semiconductor layer of the resistor structure, and another one of the plugs directly contact the conductive layer of the bit line structure.

7. The semiconductor memory device according to claim 6, further comprising:
a silicide layer, only disposed between the one of the plugs and the first semiconductor layer.

8. The semiconductor memory device according to claim 4, further comprising:
gate line structure, disposed on the active areas, the gate line structure comprising:
the second conductive layer;
the second capping layer, disposed on the second semiconductor layer; and
the third spacer.

9. The semiconductor memory device according to claim 8, wherein the interlayer dielectric layer completely covers the gate line structure, and a top surface of the interlayer dielectric layer is higher than a top surface of second capping layer of the gate line structure.

10. The semiconductor memory device according to claim 8, wherein a top surface of the third spacer is lower than a top surface of the second spacer.

11. The semiconductor memory device according to claim 1, wherein a top surface of the first spacer is lower than a top surface of the second spacer.

12. The semiconductor memory device according to claim 1, wherein the first capping layer and the second capping layer comprise different materials.

13. A semiconductor memory device, comprising:
a substrate having a plurality of active areas and a plurality of isolating regions;
a resistor structure disposed on one of the plurality of isolating regions, from bottom to top of the resistor structure sequentially comprising:
a first semiconductor layer; and
a first capping layer; and
a bit line structure, disposed on the substrate to intersect the active areas and a portion of the plurality of isolating regions, from bottom to top of the bit line structure sequentially comprising:
a second semiconductor layer, wherein the first semiconductor layer and the second semiconductor layer comprise coplanar top surface and a same semiconductor material;
a first conductive layer; and
a second capping layer.

14. The semiconductor memory device according to claim 13, wherein bottom surfaces of the resistor structure and the bit line structure are coplanar with each other, and a top surface of the resistor structure is lower than a top surface of the bit line structure.

15. A semiconductor memory device, comprising:
a substrate having a plurality of active areas and an isolating region;
a resistor structure, comprising:
a first semiconductor layer;
a first capping layer, disposed on the first semiconductor layer; and
a first spacer, directly in contact with sidewalls of the first semiconductor layer and the first capping layer; and
a bit line structure, disposed on the substrate to intersect the active areas and the isolating region, and the bit line structure comprising:
a second semiconductor layer;
a first conductive layer, disposed on the second semiconductor layer;
a second capping layer, disposed on the first conductive layer; and a second spacer, directly in contact with sidewalls of the second semiconductor layer, the first conductive layer, and the second capping layer;

wherein bottom surfaces of the resistor structure and the bit line structure are coplanar with each other, and a top surface of the resistor structure is lower than a top surface of the bit line structure.

16. The semiconductor memory device according to claim 15, further comprising:

a composited dielectric layer, disposed on the substrate and covering the active areas and the isolating region, wherein the composited dielectric layer comprises a first silicon oxide layer, a silicon nitride layer and a second silicon oxide layer stacked from bottom to top.

17. The semiconductor memory device according to claim 16, wherein the first spacer of the resistor structure and the second spacer of the bit line structure are respectively disposed on the composited dielectric layer.

18. The semiconductor memory device according to claim 15, further comprising:

an interlayer dielectric layer, disposed on the resistor structure of the interlayer dielectric layer is flushed with a top surface of the second capping layer of the bit line structure.

19. The semiconductor memory device according to claim 18, wherein a top surface of the interlayer dielectric layer is higher than a top surface of first capping layer.

20. The semiconductor memory device according to claim 15, further comprising:

a plurality of plugs, disposed on the substrate, one of the plugs directly contacts the first semiconductor layer of the resistor structure, and another one of the plugs directly contact the conductive layer of the bit line structure; and a silicide layer, only disposed between the one of the plugs and the first semiconductor layer.

* * * * *